(12) United States Patent
Watanabe

(10) Patent No.: US 7,282,800 B2
(45) Date of Patent: Oct. 16, 2007

(54) SEMICONDUCTOR DEVICE AND METHOD OF MANUFACTURING THE SAME

(75) Inventor: Kiyonori Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 185 days.

(21) Appl. No.: 10/902,467

(22) Filed: Jul. 30, 2004

(65) Prior Publication Data

US 2005/0040543 A1    Feb. 24, 2005

(30) Foreign Application Priority Data

Jul. 31, 2003  (JP)  .............. 2003-204616
Jul. 2, 2004   (JP)  .............. 2004-197051

(51) Int. Cl.
*H01L 23/52*  (2006.01)

(52) U.S. Cl. ...................... 257/737; 257/778

(58) Field of Classification Search ........... 257/737, 257/738, 778
See application file for complete search history.

(56) References Cited

U.S. PATENT DOCUMENTS 5,677,576 A * 10/1997 Akagawa .............. 257/785
6,111,317 A *  8/2000 Okada et al. .......... 257/737

* cited by examiner

*Primary Examiner*—Roy Karl Potter
(74) *Attorney, Agent, or Firm*—Rabin & Berdo, PC

(57) ABSTRACT

The present invention provides a semiconductor device capable of improving productivity while maintaining electrical characteristics, and a manufacturing method thereof. One characteristic point of the present invention is that a plating processing condition (A) for forming a metal wiring layer (redistribution wiring) corresponding to a first conductive layer and a plating processing condition (B) for forming a post electrode corresponding to a second conductive layer are made different from each other.

15 Claims, 12 Drawing Sheets

| COPPER SULFATE PENTAHYDRATE | | 110g/L |
|---|---|---|
| SULFURIC ACID | | 180g/L |
| CHLORINE | | 40mg/L |
| ADDITIVE | HIGH MOLECULAR WEIGHT SURFACE ACTIVE AGENT | 0.05~20g/L |
| | SULFUR SATURATED ORGANIC COMPOUND | 1~20mg/L |
| | ORGANIC DYE COMPOUND | 1~20mg/L |
| CONCENTRATION AS ADDITIVE | | 20mg/L |

Fig. 10(A)

| COPPER SULFATE PENTAHYDRATE | | 150~400g/L |
|---|---|---|
| SULFURIC ACID | | 10~100g/L |
| CHLORINE | | 30~75mg/L |
| ADDITIVE | HIGH MOLECULAR WEIGHT SURFACE ACTIVE AGENT | 0.05~20g/L |
| | SULFUR SATURATED ORGANIC COMPOUND | 1~20mg/L |
| | ORGANIC DYE COMPOUND | 1~20mg/L |

Fig. 10(B)

SEMICONDUCTOR DEVICE AND METHOD OF MANUFACTURING THE SAME

BACKGROUND OF THE INVENTION

1. Field of the Invention:

The present invention relates to a semiconductor device and a method for manufacturing the same. The present invention relates particularly to a semiconductor device having conductive layers formed by plating processing, and a method for manufacturing the same.

This application is a counterpart of Japanese patent application, Serial Number 204616/2003, filed Jul. 30, 2003.

2. Description of the Related Art:

With size reductions in portable devices, there has been a demand for a reduction in the size of semiconductor devices mounted in the portable devices. In order to meet such a demand, a semiconductor device called a "Chip Size Package" having outside dimensions approximately identical to those of a semiconductor chip has come along. As one form of the chip size package, there is known a semiconductor device called a "Wafer Level Chip Size Package" or "Wafer Level Chip Scale Package". In such a wafer level chip size package (hereinafter called "WCSP"), a resin sealing process step for protecting circuit elements from external environments, and an external terminal forming process step are collectively executed in a wafer state prior to wafer fractionalization.

One characteristic of the above WCSP resides in that the WCSP includes redistribution wirings and post electrodes (also called "columnar electrodes and protruded electrodes"). The redistribution wirings are used to arrange external terminals in area form. The post electrodes are used to relax stress caused by the difference between a thermal expansion coefficient of a semiconductor substrate and a thermal expansion coefficient of a printed circuit board. The redistribution wirings and the post electrodes are both formed by plating processing.

As a plating solution for forming the redistribution wirings and the post electrodes, the same one is generally used. A plating processing condition for forming the redistribution wirings and a plating processing condition for forming the post electrodes are generally set to the same.

The WCSP having the redistribution wirings and post electrodes formed by plating processing has been described in, for example, the following document (see, for example, a patent document 1).

Patent document 1

Japanese Laid-open Patent Application No. 2003-60120 (see FIGS. 3 and 4)

However, the WCSP needs post electrodes each having a relatively high height (height ranging from approximately 90 to 150 micrometers (μm)) for the purpose of stress relaxation. Thus, a long plating processing time interval required to form each of the post electrodes is not negligible in terms of a productivity improvement of WCSP.

It is also considered that in order to shorten the plating processing time interval, a plating processing condition at the formation of redistribution wirings and post electrodes is changed to such a condition that the time required to precipitate a plated layer becomes short. However, it turned out that when the plating condition changed simply, a phenomenon called "burning" would occur in the precipitated plated layer or abnormal precipitation would occur therein. Further, it also turned out that variations in the thickness of a plated layer in a wafer plane would increase materially.

Since the redistribution wiring is particularly micro-fabricated in its wiring width and thickness as compared with the post electrode, a current that flows through the redistribution wiring might change from a design value when the above phenomenon occurs. It is undesirable to cause such a case.

Thus, it has been desired to provide a semiconductor device capable of improving its productivity while maintaining electrical characteristics thereof, and a manufacturing method thereof.

SUMMARY OF THE INVENTION

The present invention has been thought up to overcome the foregoing problems. Therefore, it is an object of the present invention to provide a semiconductor device capable of improving its productivity while maintaining electrical characteristics thereof, and a manufacturing method thereof.

According to one aspect of the present invention, for achieving the above object, there is provided a semiconductor device comprising a semiconductor substrate having a main surface with circuit elements formed thereon, electrode pads formed on the main surface and respectively electrically connected to the circuit elements, external terminals disposed on the main surface, first conductive layers each having a first thickness which electrically connects between the external terminal and the electrode pad, and second conductive layers each having a second thickness thicker than the first thickness which electrically connects between the external terminal and the electrode pad, wherein the first conductive layers are formed by a first plating process set to a first condition, and wherein the second conductive layers are formed by a second plating process set to a second condition different from the first condition.

According to another aspect of the present invention, for achieving the above object, there is provided a method of manufacturing a semiconductor device, comprising the following steps of preparing a semiconductor substrate having a main surface formed with circuit elements and electrode pads respectively electrically connected to the circuit elements, disposing external terminals on the main surface, forming first conductive layers each having a first thickness electrically connecting between the external terminal and the electrode pad, by a first plating process set to a first condition, and forming second conductive layers each having a second thickness thicker than the first thickness electrically connecting between the external terminal and the electrode pad, by a second plating process set to a second condition different from the first condition.

The above and further objects and novel features of the invention will more fully appear from the following detailed description appended claims and the accompanying drawings.

BRIEF DESCRIPTION OF THE DRAWINGS

FIG. 10(A) and FIG. 10(B) are tables showing plating processing conditions of the present invention;

DETAILED DESCRIPTION OF THE PREFERRED EMBODIMENTS

Figure 1:
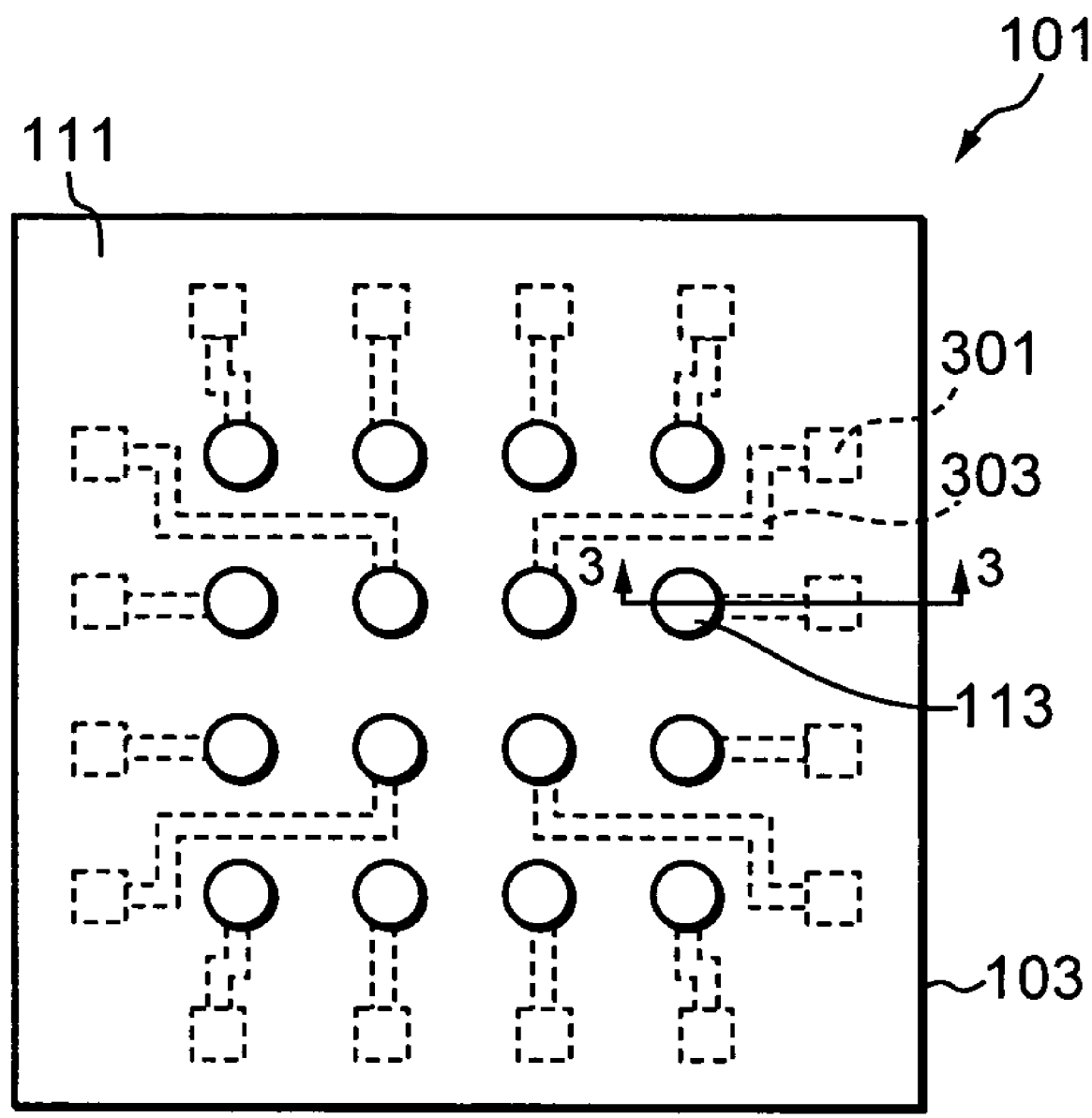
FIG. 1 is a plan perspective view showing the surface of a semiconductor device 101 according to an embodiment of the present invention.

Preferred embodiments of the present invention will be explained hereinafter in detail with reference to the figures. In order to simplify the explanation, like elements are given like or corresponding reference numerals through this specification and figures. Dual explanation of the same elements are avoided.

Preferred Embodiment

Figure 2:
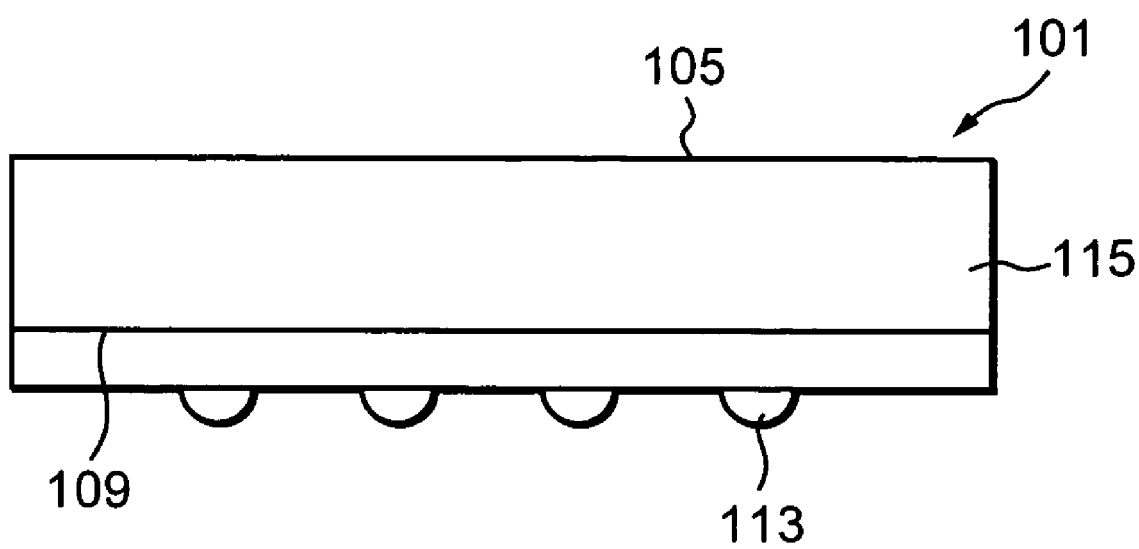
FIG. 2 is a view illustrating a side face of the semiconductor device 101 according to the embodiment of the present invention.
Figure 3:
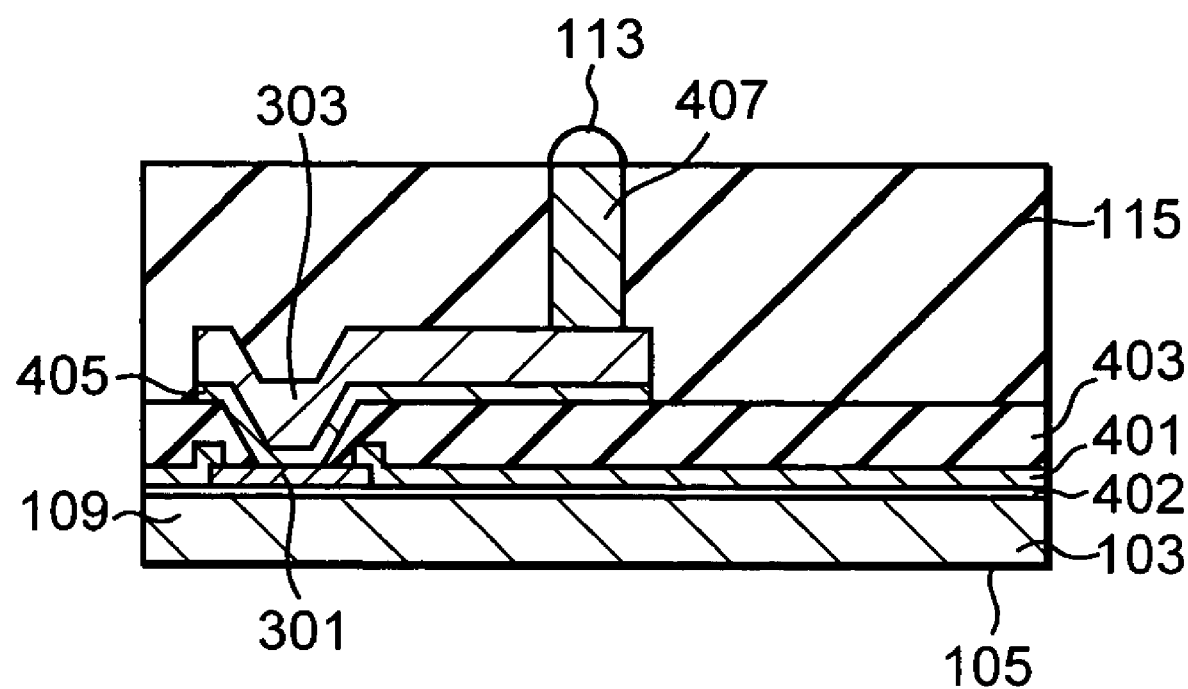
FIG. 3 is a schematic cross-sectional view taken along line 3-3 of FIG. 1.

FIG. 1 is a plan perspective view showing the surface of a semiconductor device 101 according to an embodiment of the present invention, FIG. 2 is a side view of the semiconductor device 101, and FIG. 3 is a schematic cross-sectional view taken along line 3-3 of FIG. 1, respectively.

As shown in FIGS. 1 and 2, the semiconductor device 101 has outer dimensions approximately identical to those of a semiconductor chip. In the present embodiment, the semiconductor device 101 is shaped in the form of a substantially quadrangle whose one side is about 8 mm, for example.

The semiconductor device 101 corresponds to the WCSP as mentioned previously. The semiconductor device 101 has a semiconductor substrate 103 (also called a "semiconductor chip"), an encapsulating or sealing resin 111, and a plurality of post electrodes 407. The post electrodes 407 might be called "columnar electrodes or protruded electrodes". Incidentally, each of the post electrodes 407 is defined as a second conductive layer or pattern in the specification of the present application.

The semiconductor substrate 103 has a surface 109 (main surface) with circuit elements formed thereon, and a reverse side or back 105 substantially opposite to the surface 109.

The sealing resin 111 is formed on the surface 109 of the semiconductor substrate 103 and has the function of protecting unillustrated circuit elements formed on the surface 109 from external environments.

A plurality of protruded electrodes 113 are respectively formed on the post electrodes 407 formed inside the sealing resin 111 and electrically connected to their corresponding circuit elements formed on the semiconductor substrate 103 by means of the post electrodes 407. These protruded electrodes 113 serve as external terminals of the semiconductor device 101.

Electrode pads 301, metal wiring layers 303 and the protruded electrodes 113 are illustrated in FIG. 1. Since the electrode pads 301 and the metal wiring layers 303 are located below the sealing resin 111, they are indicated by dotted lines respectively.

As shown in FIG. 1, the sixteen electrode pads 301 are provided in a peripheral area of the surface 109 of the semiconductor substrate 103 at intervals of 100 μm, for example.

The sixteen protruded electrodes 113 are disposed in matrix form on a central area of the surface 109 of the semiconductor substrate 103. The respective protruded electrodes 113 are electrically connected to their corresponding metal wiring layers 303 via the post electrodes 407.

The metal wiring layers 303 perform the function of shifting the positions (positions of electrode pads 301) of external terminals from a peripheral portion of the semiconductor substrate 103 to the central area of the semiconductor substrate 103 in area form. In general, such shift is called "relocation". Therefore, the metal wiring layers 303, which perform such shift, are called "relocating wirings or redistribution wirings". Placing the protruded electrodes 113 serving as the external terminals in the central area of the semiconductor substrate 103 in area form in this way makes it possible to relax the pitch between the external terminals of the semiconductor device 101, by extension, the pitch between terminals of a printed circuit board.

Incidentally, each of the metal wiring layers 303 is defined as a first conductive layer or pattern in the specification of the present application.

A configuration of the semiconductor device 101 will next be described in more detail by using FIG. 3.

Unillustrated plural circuit elements are formed on a surface 109 (first main surface) of a semiconductor substrate 103 made up of silicon. A steplike section 107 is provided at the back 105 (second main surface) of the semiconductor substrate 103. An insulating layer 402 having contact holes (not shown) is formed over the respective circuit elements. An unillustrated conductive layer is formed inside each contact hole.

An electrode pad 301 is formed on the insulating layer 402. The electrode pad 301 is connected to its corresponding circuit element through the conductive layer formed inside the contact hole. The electrode pad 301 is made up of aluminum containing silicon, for example.

A passivation film 401 is formed over the insulating layer 402 and a peripheral edge portion of the electrode pad 301. The passivation film 401 comprises silicon nitride, for example.

An interlayer insulator or insulating film 403 is formed over the passivation film 401. The interlayer insulating film 403 has the function of relaxing stress applied to the semiconductor substrate 103. The interlayer insulating film 403 is made up of polyimide, for example. Incidentally, the surface of the interlayer insulating film 403 located just below a metal thin-film layer 405 to be described later changes in quality. A thick line indicates an area in which the surface thereof has changed in quality. The existence of the interlayer insulating film 403 whose surface has changed in quality, yields an improvement in adhesion between the interlayer insulating film 403 and the metal thin-film layer 405.

The metal thin-film layer 405 is formed over the interlayer insulating film 403 and the electrode pad 301. The metal thin-film layer 405 may be either a single layer or a complex layer but may preferably be formed of a complex layer comprising an upper layer and a lower layer. The lower film may be a material high in adhesion to the electrode pad 301 and capable of preventing a substance constituting the upper film from diffusing into the semiconductor substrate 103 side. The lower film is made of titanium, for example. The upper film may be a material high in adhesion to the metal wiring layer 303 formed thereabove. The upper film comprises copper, for example.

The metal wiring layer 303 is formed on the metal thin-film layer 405. The metal wiring layer 303 is made of copper, for example.

A post 407 is formed on the surface of the metal wiring layer 303. In the illustrated example, the post 407 is shaped in the form of a substantially cylinder. The bottom face of the post 407 makes contact with the surface of the metal wiring layer 303, and the top thereof is in contact with the protruded electrode 113. The post 407 is made of the same material as the metal wiring layer 303, and the height (corresponding to the distance from the surface of the metal wiring layer 303 up to the surface of a sealing resin 115) thereof is about 100 µm.

The sealing resin 115 is formed over the entire surface 109 of the semiconductor substrate 103 so as to cover the whole surface 109 of the semiconductor substrate 103 except for the top of the post 407. Namely, the sealing resin 115 covers the side faces of the interlayer insulating film 403, metal thin-film layer 405, metal wiring layer 303 and post 407. The surface of the sealing resin 115 and the top of the post 407 are flush with each other. The sealing resin 115 is made up of an opaque epoxy resin, for example.

The protruded electrode 113 is formed on the top of the post 407. The protruded electrode 113 is an electrode connected to its corresponding wiring of an unillustrated printed circuit board as will be described later. Thus, each circuit element formed on the semiconductor substrate 103 is electrically connected to an external device via the electrode pad 301, metal thin-film layer 405, metal wiring layer 303, post 407 and protruded electrode 113. Thus, the protruded electrode 113 functions as an external terminal of the semiconductor device 101. The protruded electrode 113 is made of solder, for example, and shaped in the form of a semi-circular sphere.

Figure 8:
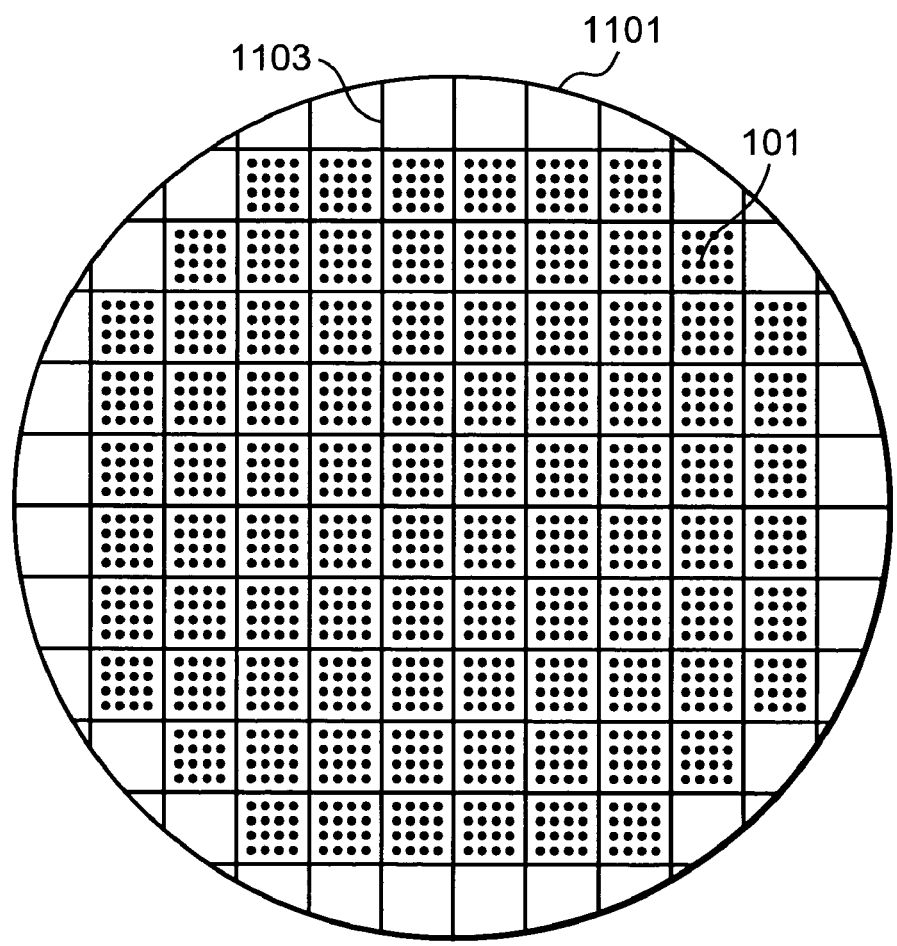
FIG. 8 is a process diagram depicting the method of manufacturing the semiconductor device 101 according to the embodiment of the present invention.

A method of manufacturing a semiconductor device 101, according to a first embodiment of the present invention will next be explained below. In order to make its description easy, a process (corresponding to a process prior to the dicing of a semiconductor wafer) up to the formation of the protruded electrodes 113 is called a "first process", and a process subsequent to the first process is called a "second process". They will be described below respectively. The first process is shown in FIGS. 4 through 7, and the second process is shown in FIGS. 8 and 9.

To begin with, the first process according to the first embodiment will be explained below.

Incidentally, only a portion corresponding to line 3-3 of FIG. 1 will be explained in the first process for the purpose of making its description easy.

Unillustrated plural circuit elements are first formed on a surface 109 (main surface) of a semiconductor substrate 103 held in a semiconductor wafer state. Next, an insulting layer 402 having contact holes (not shown) is formed over the respective circuit elements. An unillustrated conductive layer is formed inside each contact hole. Subsequently, an aluminum film containing silicon is deposited on the insulating layer 402 by a sputtering method. Afterwards, the aluminum film is etched into a predetermined shape, which in turn is left on the insulating layer 402 as an electrode pad 301 as shown in the figure. The electrode pad 301 is connected to its corresponding unillustrated conductive layer formed inside the insulating layer 402 (see FIG. 4(A)).

Next, a passivation film 401 formed of a silicon nitride film is formed on the insulating layer 402 and the electrode pad 301 by a CVD method. Thereafter, the passivation film 401 placed on a central area of the electrode pad 301 is removed by etching (see FIG. 4(B)).

Figure 4A:
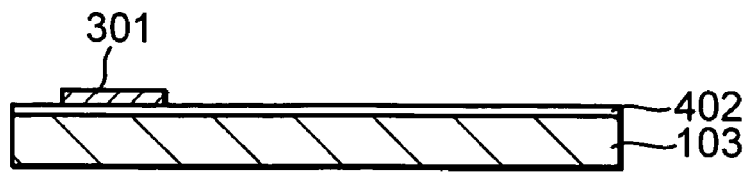
FIG. 4(A) through FIG. 4(G) are process diagrams depicting a method of manufacturing the semiconductor device 101 according to the embodiment of the present invention.
Figure 4B:
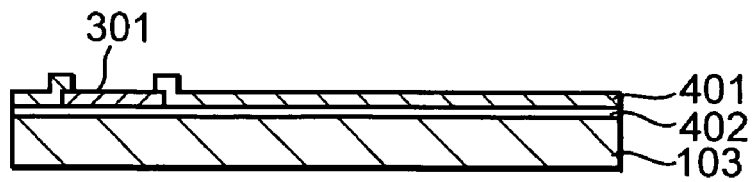
Figure 4C:
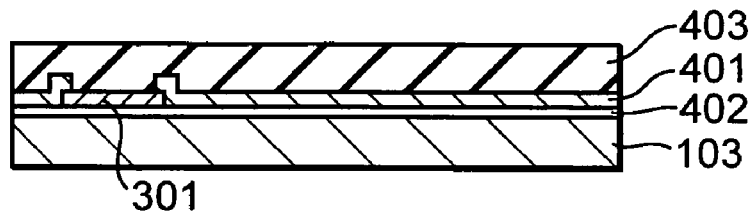

Next, an interlayer insulator or insulating film 403 formed of polyimide is formed on the passivation film 401 and the electrode pad 301 (see FIG. 4(C)).

Figure 4D:
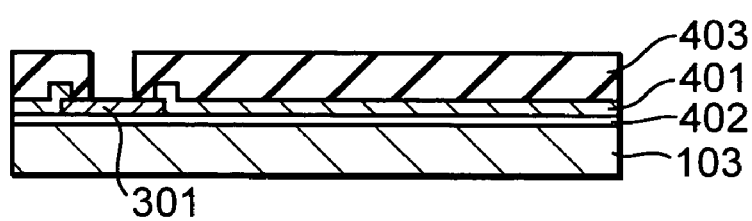
Figure 4E:
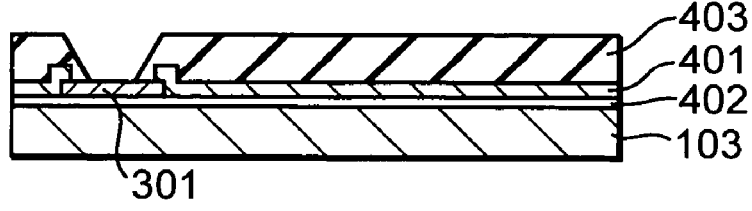
Figure 4F:
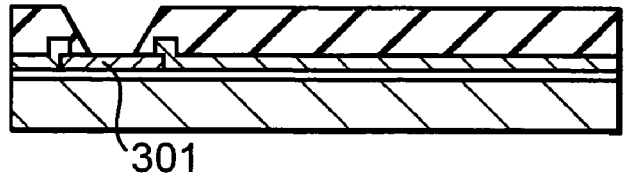

Next, the interlayer insulating film 403 placed on the central area of the electrode pad 301 is removed by etching (see FIG. 4(D)).

Heat treatment is next made to thermoset the interlayer insulating film 403 formed of polyimide. Owing to such thermosetting, the interlayer insulating film 403 located on the electrode pad 301 is shaped in tapered form as shown in the drawing. When polyimide remains on the surface of the electrode pad 301, it is removed by plasma etching in an oxygen atmosphere (see FIG. 4(E)).

Next, the interlayer insulating film 403 is subjected to plasma etching in an atmosphere of an inert gas such as an argon gas or the like, so that the surface of the interlayer insulating film 403 changes in quality. A surface layer thereof having changed in quality is indicated by a thick line. The existence of the surface layer yields an improvement in adhesion between the interlayer insulating film 403 and a metal thin-film layer 405 formed in the following step (see FIG. 4(F)).

Figure 4G:
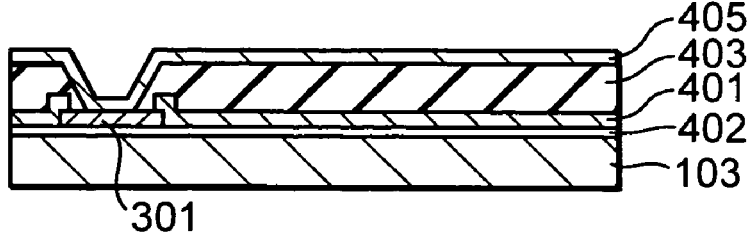

Next, the metal thin-film layer 405 is formed on the interlayer insulating film 403 and the electrode pad 301 by the sputtering method (see FIG. 4(G)).

A resist 801 is next formed on the metal thin-film layer 405. The thickness of the resist is about 10 µm, for example. Subsequently, the resist 801 located in an illustrated predetermined area is removed by etching (see FIG. 5(A)).

Next, a metal wiring layer 303 is selectively formed on the metal thin-film layer 405 exposed by electrolytic plating. Incidentally, the thickness of the metal wiring layer 303 is thinner than that of the resist 801 and is 5 µm, for example (see FIG. 5(B)).

A condition for plating processing at this time is shown in FIG. 10(A). Further, a plating current density at this time is 2.0 A/dm2. Also the time required to perform the plating processing is about 20 minutes.

Figure 5A:
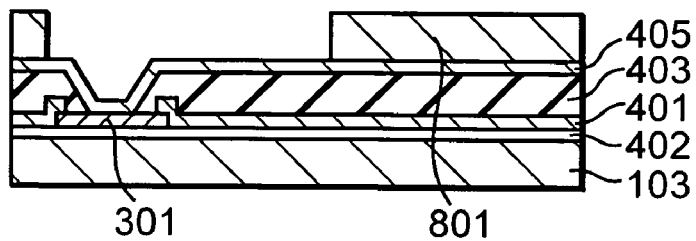
FIG. 5(A) through FIG. 5(E) are process diagrams showing the method of manufacturing the semiconductor device 101 according to the embodiment of the present invention.
Figure 5B:
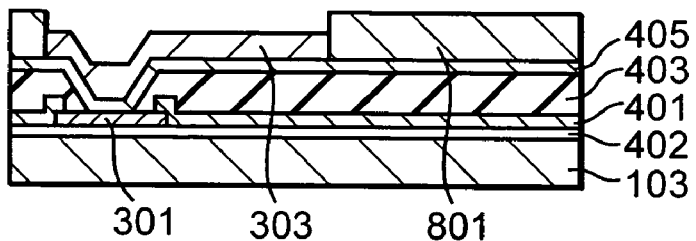
Figure 5C:
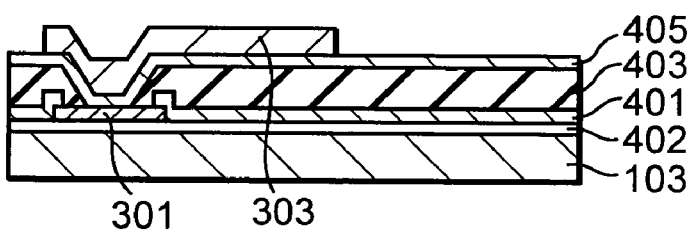
Figure 5D:
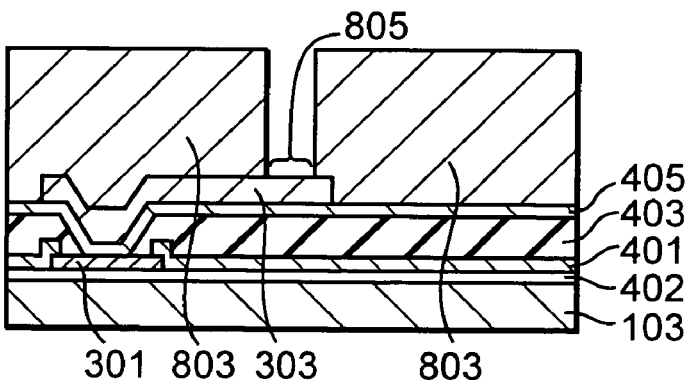
Figure 5E:
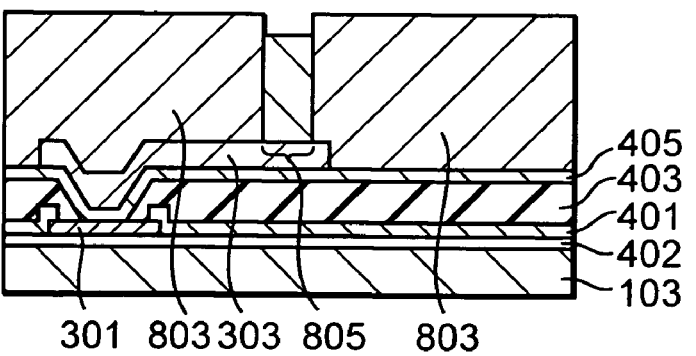

Next, the resist 801 is removed by using a remover such as acetone or the like (see FIG. 5(C)).

Next, a resist 803 having a thickness of about 120 µm is formed on the metal thin-film layer 405 and the metal wiring layer 303. Subsequently, the resist 803 placed on a post forming area 805 is removed (see FIG. 5(D)).

A post electrode 407 is next formed on the post forming area 805 by the electrolytic plating. Incidentally, the thickness of the post electrode 407 is thinner than that of the resist 803 and is about 100 µm. Further, the post electrode 407 is formed of the same material as the metal wiring layer 303.

A condition for plating processing at this time is illustrated in FIG. 10(B). Further, a plating current density at this time ranges from 10 to 40 A/dm2. Incidentally, the time required to perform the plating processing is about 12 minutes (see FIG. 5(E)).

Figure 11:
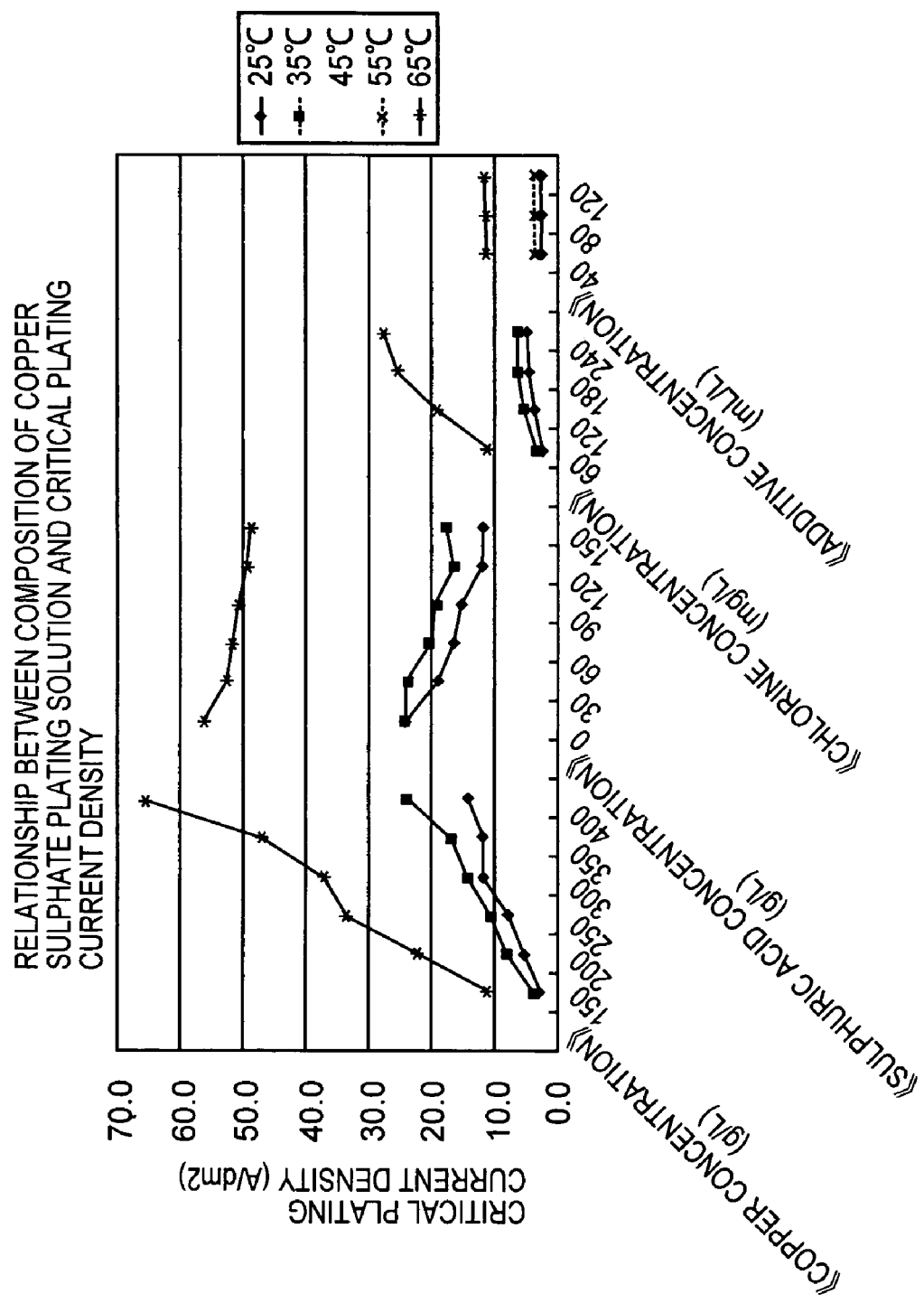
FIG. 11 is a graph depicting experimental data for determining plating processing conditions of the present invention.
Figure 12:
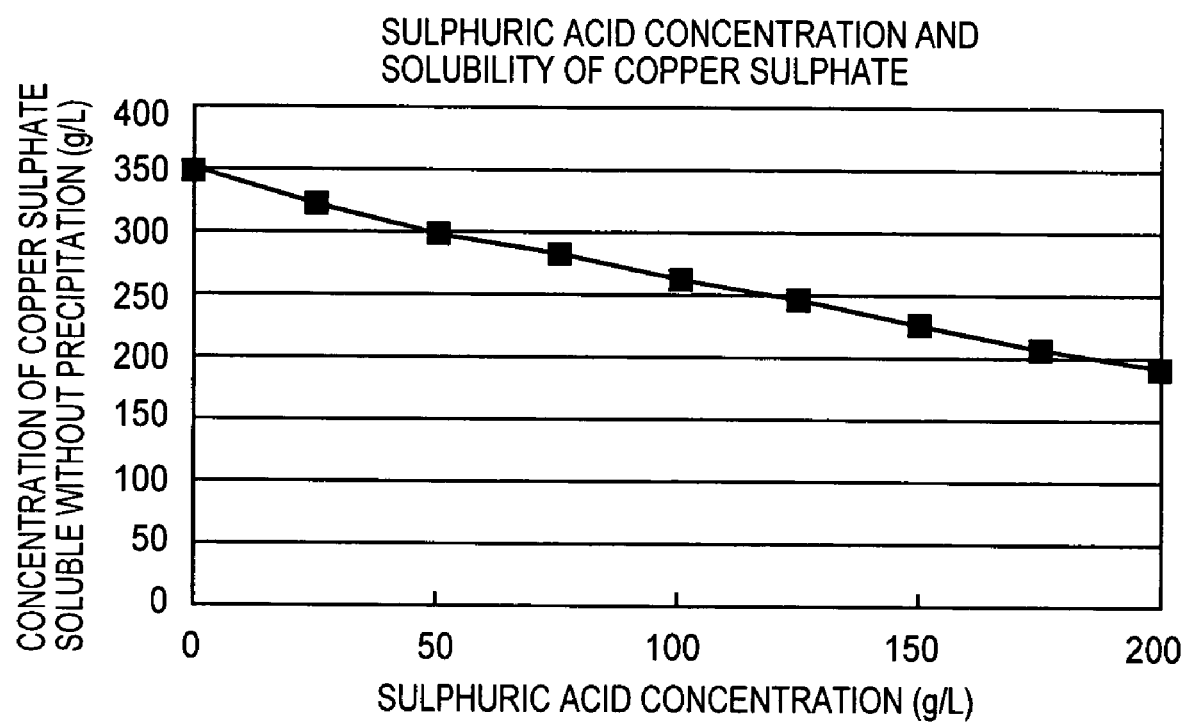
FIG. 12 is a graph illustrating experimental data for determining plating processing conditions of the present invention.
Figure 13:
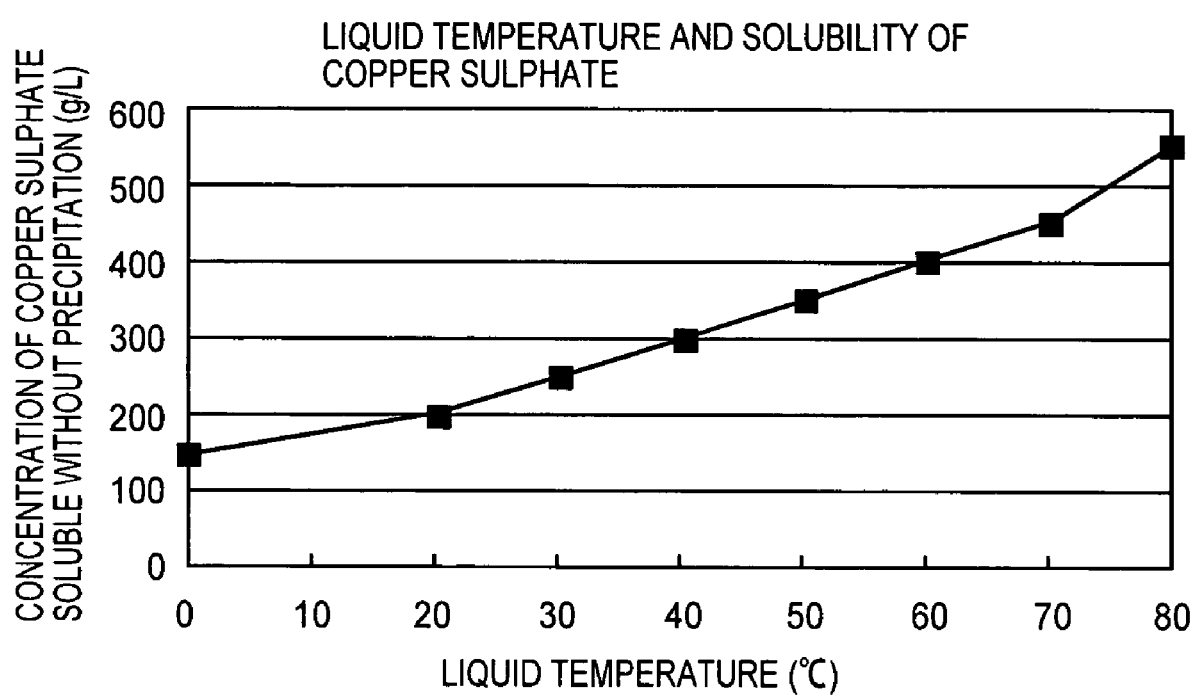
FIG. 13 is a graph showing experimental data for determining plating processing conditions of the present invention.

As described above, a basis which makes the plating processing condition for forming the post electrode 407 different from the plating processing condition for forming the metal thin-film layer 405, can be explained with reference to FIGS. 11 through 13.

Namely, a copper sulphate plating solution is largely divided into copper sulfate pentahydrate, sulphuric acid, hydrochloric acid, and additives composed of a high molecular weight surface active agent, a sulfur saturated organic compound and an organic dye compound, etc. The remainder is water.

It was obtained from FIG. 1 that such plating concentrations as to exert a great influence to increase a plating growth rate included copper sulphate concentration and sulphuric acid concentration but were not significantly ascribable to hydrochloric acid concentration and additive concentration.

High copper sulphate concentration makes it possible to set a plating current density high and shorten a plating time interval. However, in order to avoid the precipitation of a crystal of copper sulphate, the copper sulphate is generally used up to about 150 g/L. In the present invention, as is apparent from the result of FIG. 12, sulphuric acid concentration in a sulfuric acid solution is extremely reduced to increase the solubility of copper sulphate in the sulfuric acid solution. As is apparent from the result of FIG. 13, the temperature of the solution or liquid is raised to increase the solubility of copper sulphate. Such two points enable the use of a plating solution containing a high concentration of copper sulphate.

As described above, the concentration of copper sulfate pentahydrate in the sulfuric solution containing copper sulphate is greatly raised and the sulphuric acid concentration is reduced to the required minimum concentration, thereby making it possible to noticeably increase the precipitation rate of copper. Thus the time required to form the post electrode is shortened so that productivity can be greatly improved.

Figure 6A:
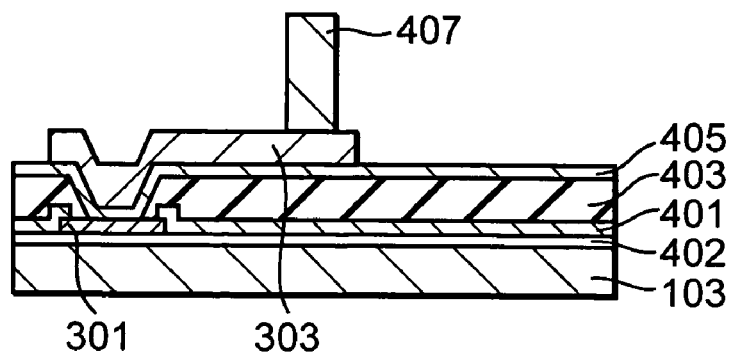
FIG. 6(A) through FIG. 6(D) are process diagrams illustrating the method of manufacturing the semiconductor device 101 according to the embodiment of the present invention.

Next, the resist 805 is removed by a remover (see FIG. 6(A)).

Figure 6B:
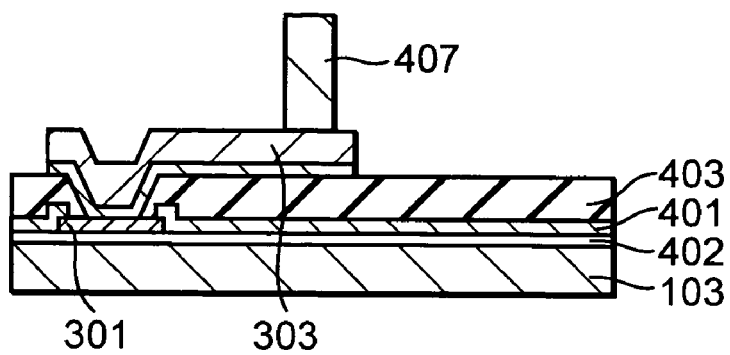
Figure 6C:
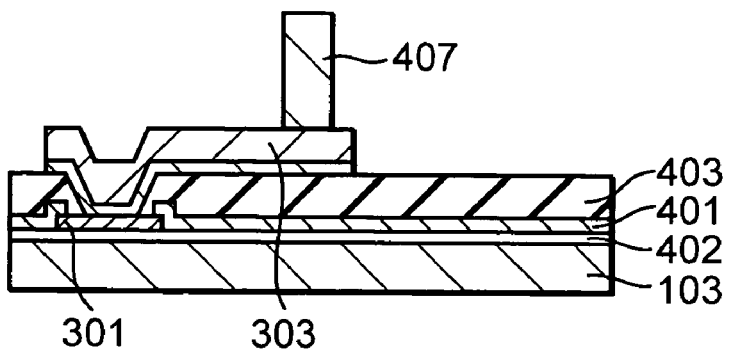
Figure 6D:
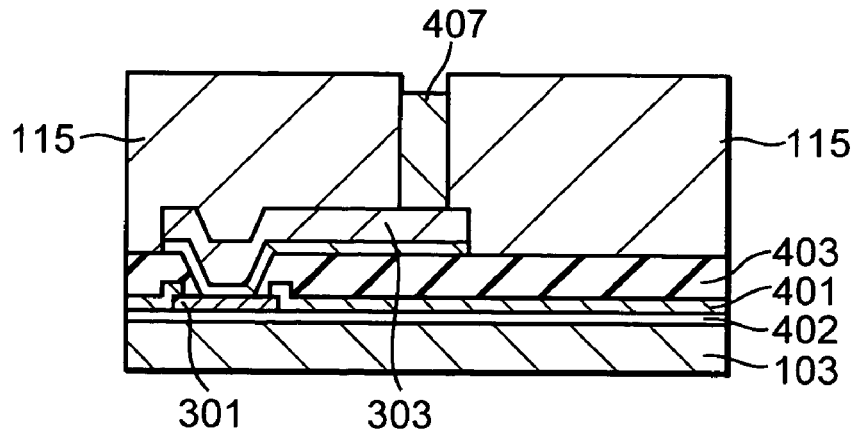
Figure 7:
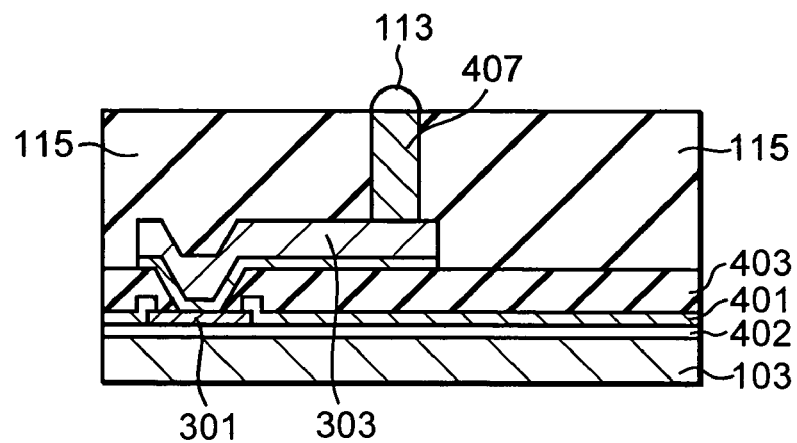
FIG. 7 is a process diagram showing the method of manufacturing the semiconductor device 101 according to the embodiment of the present invention.

Next, the exposed metal thin-film layer 405 is removed by being exposed to plasma etching in an atmosphere of an oxygen gas (FIG. 6(B)).

Next, the surface layer of the exposed interlayer insulating film 403 is removed by wet etching. Thus, a current, which flows through the metal wiring layer 303, can be prevented from leaking into another metal wiring layer 303 through the surface layer (see FIG. 6(C)).

Next, the whole semiconductor wafer is inserted into an unillustrated sealing mold. With the injection of an encapsulating or sealing resin inside the sealing mold, a sealing resin 115 is subsequently formed on the surface 109 side of the semiconductor substrate 103. As shown in the drawing, the sealing resin 115 covers the side faces of the interlayer insulating film 403, the metal thin-film layer 405, the metal wiring layer 303 and the post electrode 407 (see FIG. 6(D)).

Next, the surface of the sealing resin 115 and the surface of the post electrode 407 are polished. The surface of the sealing resin 115 and the upper surface of the post electrode 407 are located within substantially the same plane.

Next, a protruded electrode 113 is formed on its corresponding upper surface of the post electrode 407 by a screen printing method. The protruded electrode 113 is made up of solder and is hemispherical (see FIG. 7).

The surface side of a semiconductor wafer 1101 subjected to the above-described process is shown in FIG. 8. FIG. 11 shows that a plurality of semiconductor devices 101, which will be fractionized in the second process to be described later, are disposed in a semiconductor wafer state. These semiconductor devices 101 are spaced away from one another by a plurality of scribe areas 1103.

The second process following the first process referred to above will next be explained below using FIG. 9.

FIG. 9 is a process diagram showing the second process for the semiconductor device 101 according to the present embodiment. Incidentally, the illustration of part of a structure thereof is omitted in order to facilitate its description.

Figure 9A:
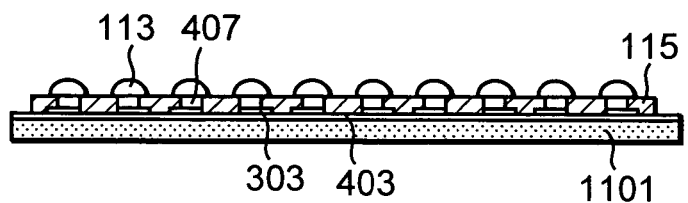
FIG. 9(A) through FIG. 9(D) are process diagrams illustrating the method of manufacturing the semiconductor device 101 according to the embodiment of the present invention.

Firstly, the state of the semiconductor device 101 subjected to the process of from FIG. 4 to FIG. 7 is shown in FIG. 9(A).

A semiconductor wafer 1101, an interlayer insulator or insulating film 403, a metal wiring layer 303, post electrodes 407 and protruded electrodes 113 are shown in FIG. 9(A).

A wafer holder 1203 having a wafer ring 1205 and a dicing sheet 1207 is next prepared. The wafer ring 1205 has a ring shape. The dicing sheet 1207 makes use of a UV tape having such a characteristic that it is reduced in adhesive power by being irradiated with ultraviolet light, for example.

Figure 9B:
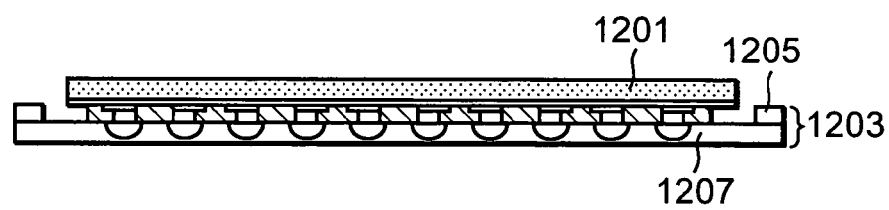
Figure 9C:
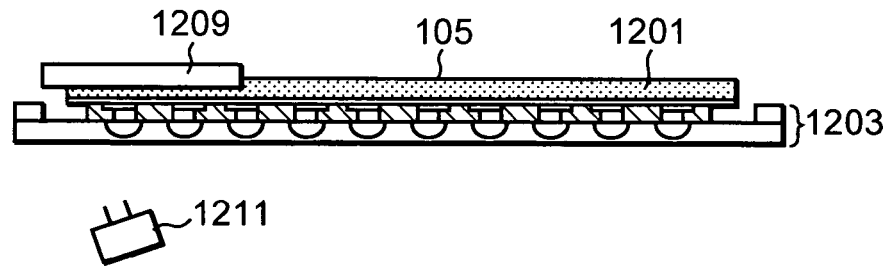

The semiconductor wafer 1101 is attached onto the dicing sheet 1207 so that the protruded electrodes 113 make contact with the dicing sheet 1207 (see FIG. 9(B)).

Next, the wafer holder 1203 is placed on an unillustrated grinder having two diamond grinding stones 1209. The first diamond grinding stone 1209 has a roughness of #325, and the second diamond grinding stone 1209 has a roughness of #2000. The back of the semiconductor wafer 1101 placed on the grinder is ground as follows: To begin with, the back thereof is roughly polished by the first diamond grinding stone, and subsequently finely ground by the second diamond grinding stone. Owing to these grinding processes, a semiconductor wafer 1101 having a thickness of about 310 μm is finally obtained.

Further, owing to the grinding done by the second diamond grinding stone, the back of the semiconductor wafer is brought into the aforementioned mirror state. If such fine back grinding is not done, then the mirror state might not be produced. However, the detection of each scribe area by an infrared camera in a process step of FIG. 9(D) needs the fine grinding by the second diamond grinding stone. This is because if the state of the back of the semiconductor substrate 103 is rough, then infrared light is not easily transmitted therethrough (see FIG. 9(C)).

Next, the semiconductor wafer 1101 is placed on a dicing device with an unillustrated infrared camera 1211 in a state of being placed on the wafer ring 1205. The dicing device has at least one blade.

Figure 9D:
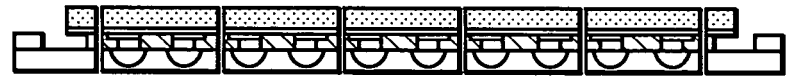

As shown in FIG. 9(D), pattern shapes of a plurality of electrode pads 301 or metal wiring layers 303 formed on the surface 109 side of the semiconductor wafer are first recognized from the back of the semiconductor wafer 1101 by the infrared camera 1211. Consequently, the scribe areas, which exist on the surface 109 of the semiconductor wafer 1101, are recognized by the dicing device.

Next, the blade is placed on the center line of each scribe area, i.e., the scribe line. Thereafter, the back 105 of the semiconductor wafer 1101 is ground about 400 μm along each scribe line by means of the blade. The grinding by the blade (fully cut) is executed in association with the respective semiconductor devices 101 of the semiconductor wafer 1101. As a result, the respective semiconductor devices 101 are brought into separation or fractionalization (see FIG. 9(D)).

Next, the semiconductor wafer 1101 is shifted to an expand ring together with the dicing sheet 1207. Thereafter, the dicing sheet 1207 is subjected to ultraviolet rays, so that its adhesive power is lowered. The dicing sheet 1207 is extended in the outer peripheral direction of the semiconductor wafer 1101 and the respective semiconductor devices 101 are taken out by a collet.

The semiconductor device 101 shown in FIG. 1 is finally obtained through the above-described second process.

An advantageous effect obtained by a typical semiconductor device of the inventions disclosed in the present application will be described in brief as follows:

According to the semiconductor device of the present invention, since a plating processing condition for forming a second conductive layer is made different from a plating processing condition for forming a first conductive layer, an improvement in productivity thereof can be achieved while maintaining its electrical characteristics.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device, comprising:
    a semiconductor substrate having a main surface with circuit elements formed thereon;
    electrode pads formed on the main surface and respectively electrically connected to the circuit elements;
    an insulating film which has openings each exposing part of the surface of each of the electrode pads and covers the main surface;
    first conductive patterns each extending from the surface of the electrode pad to the surface of the insulating film and formed by a first plating process set to a first condition;
    second conductive patterns each electrically connected to a respective first conductive pattern, each having a surface ground together with an encapsulating resin and formed by a second plating process set to a second condition different from the first condition;
    the encapsulating resin which has a surface ground together with the second conductive patterns and covers the first conductive patterns and the insulating film; and
    external terminals each formed on the surface of the respective second conductive patterns.

2. A semiconductor device according to claim 1, wherein the first conductive pattern is a redistribution wiring of a wafer level chip size package.

3. A semiconductor device according to claim 1, wherein the second conductive pattern is a protruded electrode having a top surface and a bottom surface, the top surface being ground with the encapsulating resin and the bottom surface being contacted to the first conductive pattern.

4. A semiconductor device according to claim 1, wherein the respective surfaces of the second conductive patterns are flush with and in a same plane as, an upper surface of the encapsulating resin.

5. A semiconductor device according to claim 1, further comprising an insulating layer disposed over said semiconductor substrate and under said electrode pads.

6. A semiconductor device according to claim 5, further comprising a passivation film disposed over said insulating layer and under said insulating film.

7. A semiconductor device according to claim 1, further comprising a passivation film disposed over said semiconductor substrate and under said insulating film.

8. A semiconductor device according to claim 1, further comprising metal thin films, each being disposed between a respective electrode pad and a respective first conductive pattern.

9. A semiconductor device, comprising:
    a semiconductor substrate having a main surface with a circuit element formed thereon;
    at least one electrode pad formed on the main surface and being electrically connected to the circuit element;
    an insulating film having an opening that exposes part of a surface of the electrode pad, and which covers the main surface;
    at least one first conductive pattern extending from above the surface of the electrode pad to above the surface of the insulating film;
    an encapsulating resin which covers the first conductive pattern and the insulating film;
    at least one second conductive pattern electrically connected to the first conductive pattern, and having a top surface that is flush with and in a same plane as, a surface of the encapsulating resin; and
    at least one external terminal formed on the surface of the second conductive pattern.

10. A semiconductor device according to claim 9, wherein the second conductive pattern is a protruded electrode having the top surface and a bottom surface, the top surface being ground with the encapsulating resin and the bottom surface contacting the first conductive pattern.

11. A semiconductor device according to claim 9, wherein the first conductive pattern is a redistribution wiring of a wafer level chip size package.

12. A semiconductor device according to claim 9, further comprising an insulating layer disposed over said semiconductor substrate and under said electrode pad.

13. A semiconductor device according to claim 12, further comprising a passivation film disposed over said insulating layer and under said insulating film.

14. A semiconductor device according to claim 9, further comprising a passivation film disposed over said semiconductor substrate and under said insulating film.

15. A semiconductor device according to claim 9, further comprising a metal thin film disposed between said electrode pad and said first conductive pattern.

* * * * *